US008653571B2

(12) United States Patent
Morooka et al.

(10) Patent No.: US 8,653,571 B2
(45) Date of Patent: Feb. 18, 2014

(54) SEMICONDUCTOR DEVICE

(75) Inventors: Tetsu Morooka, Yokohama (JP); Masaki Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/399,018

(22) Filed: Feb. 17, 2012

(65) Prior Publication Data

US 2012/0223374 A1 Sep. 6, 2012

(30) Foreign Application Priority Data

Mar. 3, 2011 (JP) .................... 2011-046151

(51) Int. Cl.
*H01L 21/02* (2006.01)
*H01L 21/336* (2006.01)

(52) U.S. Cl.
USPC ............................ 257/295; 438/299; 438/300

(58) Field of Classification Search
None
See application file for complete search history.

(56) References Cited

U.S. PATENT DOCUMENTS

| 8,022,474 B2 * | 9/2011 | Haeberlen et al. | 257/331 |
| 2006/0273381 A1 * | 12/2006 | Kim et al. | 257/330 |
| 2007/0007571 A1 * | 1/2007 | Lindsay et al. | 257/306 |
| 2007/0170522 A1 * | 7/2007 | Lee et al. | 257/401 |
| 2008/0035991 A1 * | 2/2008 | Lee et al. | 257/331 |
| 2010/0103718 A1 * | 4/2010 | Asao et al. | 365/148 |

FOREIGN PATENT DOCUMENTS

| JP | 2007-201396 A | 8/2007 |
| JP | 2008-47909 A | 2/2008 |

OTHER PUBLICATIONS

Makoto Yoshida, et al., "Recessed Channel Fin Field-Effect Transistor Cell Technology for Future-Generation Dynamic Random Access Memories", Japanese Journal of Applied Physics, vol. 47, No. 4, 2008, 2 pgs.
Sung-Woong Chung, et al., "Highly Scalable Saddle-Fin (S-Fin) Transistor for Sub-50nm DRAM Technology", Symposium on VLSI Technology Digest of Technical Papers, 2006, 1 pg.
Japanese Office Action issued Jun. 25, 2013 in Patent Application No. 2011-046151 with English Translation.

* cited by examiner

*Primary Examiner* — Matthew Landau
*Assistant Examiner* — Priya Rampersaud
(74) *Attorney, Agent, or Firm* — Oblon, Spivak, McClelland, Maier & Neustadt, L.L.P.

(57) ABSTRACT

A semiconductor device according to an embodiment includes: a semiconductor region on a semiconductor substrate, an upper face and side faces of the semiconductor region forming a saddle-like shape, convex portions being formed at both ends of a region including a saddle point in the upper face; a gate insulating film on the upper face of the semiconductor region except upper faces of the convex portions, and on side faces of the convex portions on a side of the region including the saddle point in the upper face; a gate electrode on the gate insulating film and including: a main body part located immediately above the region including the saddle point in the upper face; and leg portions leading to the main body portion and covering the side faces of the semiconductor region, a length of the leg portions being greater than a length of the main body portion.

11 Claims, 17 Drawing Sheets

SEMICONDUCTOR DEVICE

CROSS-REFERENCE TO RELATED APPLICATION

This application is based upon and claims the benefit of priority from prior Japanese Patent Application No. 2011-46151 filed on Mar. 3, 2011 in Japan, the entire contents of which are incorporated herein by reference.

FIELD

Embodiments described herein relate generally to semiconductor devices.

BACKGROUND

Transistors called RCATs (Recessed Channel Array Transistors) are used as cell transistors in DRAMs. Those transistors have an advantage over conventional planar MOSFETs, being capable of reducing off-state current leakage. However, it is difficult to also satisfy the requirement for drive current with a RCAT structure, as in a MRAM.

In view of the above, S-Fin (Saddle-Fin) field effect transistors with greater channel widths W than those of RCATs have been suggested. However, the source portions of S-Fin transistors are not larger than those of RCATs. Therefore, it is difficult to achieve the required drive current with those S-Fin transistors.

DETAILED DESCRIPTION

A semiconductor device according to an embodiment includes: a semiconductor substrate; a semiconductor region formed on the semiconductor substrate, an upper face and side faces of the semiconductor region forming a saddle-like shape, convex portions being formed at both ends of a region including a saddle point in the upper face, the both ends lying in a first direction; a gate insulating film formed on the upper face of the semiconductor region except upper faces of the convex portions, on side faces of the semiconductor region extending in the first direction, and on side faces of the convex portions on a side of the region including the saddle point in the upper face, the side faces of the convex portions extending in a second direction perpendicular to the first direction; a gate electrode formed on the gate insulating film, the gate electrode including: a main body part located immediately above the region including the saddle point in the upper face; and leg portions leading to the main body portion and covering the side faces of the semiconductor region extending in the first direction, a length of the leg portions in the first direction being greater than a length of the main body portion in the first direction, the main body portion being located immediately above the region including the saddle point in the upper face; and first and second impurity regions formed in portions of the semiconductor substrate, the portions being located on both sides of the gate electrode.

The following is a description of embodiments, with reference to the accompanying drawings.

First Embodiment

Figure 1:
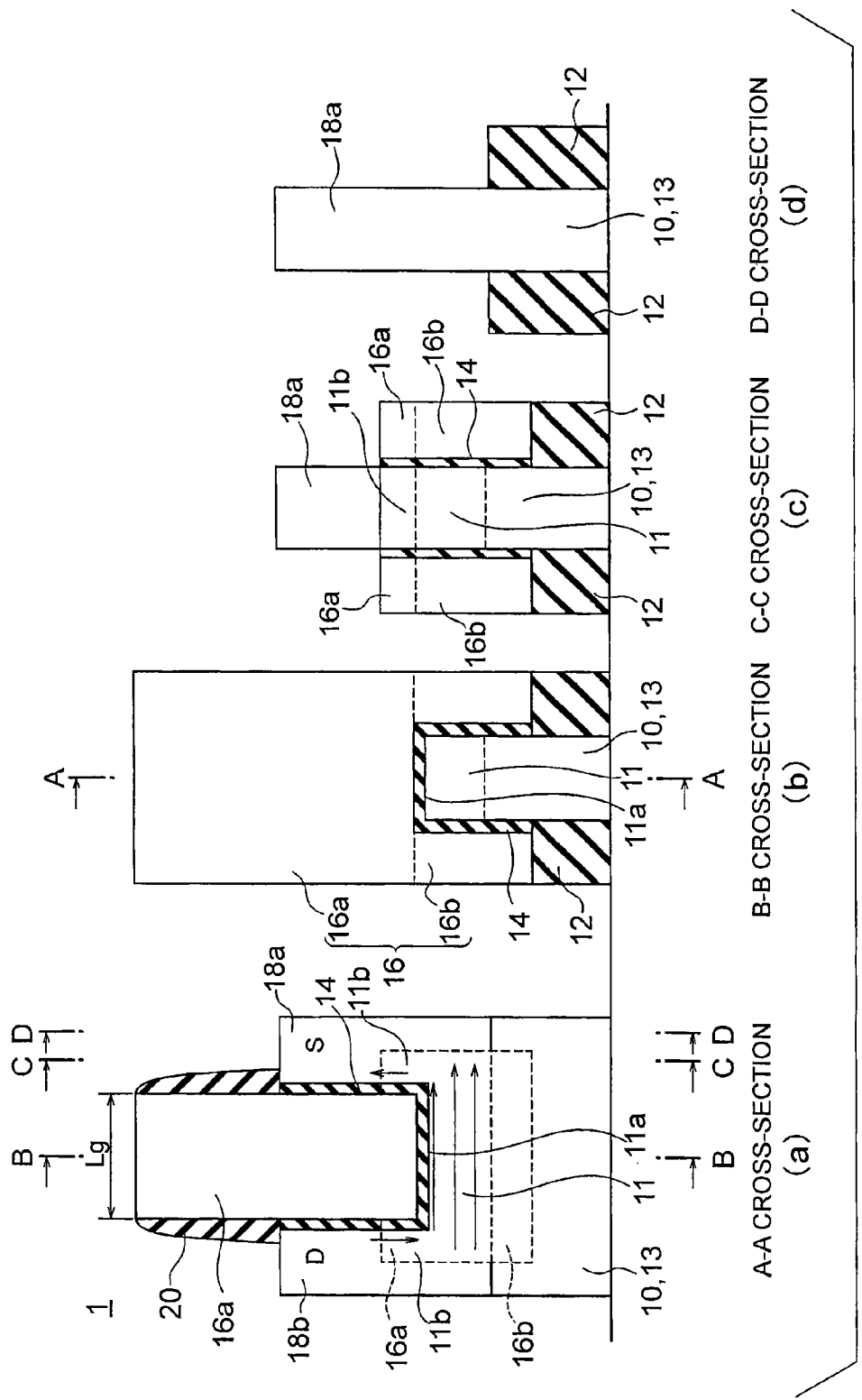
FIGS. 1(a) through 1(d) are cross-sectional views of a semiconductor device according to a first embodiment.

FIGS. 1(a) through 1(d) illustrate a semiconductor device of a first embodiment. The semiconductor device of the first embodiment includes a transistor 1, and FIG. 1(a) shows a cross-sectional view of the transistor 1. FIGS. 1(b), 1(c), and 1(d) show cross-sectional views of the transistor 1 of the first embodiment, taken along the section lines B-B, C-C, and D-D, respectively, of FIG. 1(a). FIG. 1(a) shows a cross-sectional view of the transistor 1, taken along the section line A-A of FIG. 1(b).

The transistor 1 of the first embodiment is provided in a device region 13 of a semiconductor substrate 10 that is a Si substrate, for example. This device region 13 is divided into respective devices by device isolating regions 12 made of an insulating material. In the transistor 1, a channel region 11 made of the same material as the semiconductor substrate 10 is formed on the semiconductor substrate 10. The channel region 11 has an upper face and side faces in a saddle-like form. That is, as shown in FIG. 1(a), convex portions 11b exist at both ends of the region 11a including the saddle point in the upper face of the channel region 11 in a first direction (the current flowing direction) (FIGS. 1(a) and 1(c)), and the region 11a including the saddle point forms the highest plane with respect to the semiconductor substrate 10 in a second direction perpendicular to the first direction (FIGS. 1(a) and 1(b)). The region 11a including the saddle point is flat in this embodiment (FIGS. 1(a) and 1(b)).

A gate insulating film 14 is formed on the upper face of the channel region 11 except the convex portions 11b and on the side faces of the channel region 11 extending in the first direction. The side faces of the convex portion 11b on the side of the region 11a including the saddle point are also covered with the gate insulating film 14. The gate insulating film 14 also extends on part of the side faces of the device region 13 (the semiconductor substrate 10) immediately below the channel region 11 (FIGS. 1(a) and 1(b)). A gate electrode 16 is provided to cover the gate insulating film 14. The gate electrode 16 includes a main body portion 16a provided on the region 11a including the saddle point of the channel region 11, and leg portions 16b that are provided on the side portions of the channel region 11 and on part of the side faces of the device region 13 immediately below the channel region 11, and sandwich the gate insulating film 14 therebetween. The main body portion 16a also extends on the leg portions 16b (FIGS. 1(a), 1(b), and 1(c)). Therefore, the length of the main body portion 16a extending in the first direction on the leg portions 16b is substantially the same as the length of the leg portions 16b in the first direction. The length of the leg portions 16b in the first direction is greater than the gate length Lg of the gate electrode 16 shown in FIG. 1(a). It should be noted that the shape of the gate electrode 16 can be compared to the shape a "human being" riding on the channel region 11 having a saddle-like shape. The leg portions 16b are equivalent to the legs of the "human being", and the main body portion 16a is equivalent to the torso of the "human being." The length of the channel region 11 in the first direction is greater than the length of the gate electrode 16 in the first direction (FIG. 1(a)), and the length of the channel region 11 in the second direction is smaller than the length of the gate electrode 16 in the second direction (FIG. 1(b)).

As shown in FIG. 1(a), a source region 18a and a drain region 18b doped with impurities are formed at a distance from each other in the first direction on portions of the semiconductor substrate 10 located on both sides of the gate electrode 16, with the channel region 11 and the gate electrode 16 being interposed between the source region 18a and the drain region 18b. As shown in FIG. 1(a), the source region 18a and the drain region 18b are provided to cover the upper faces of the convex portions 11b of the channel region 11 and part of the side faces of the channel region 11 perpendicular to the first direction. Therefore, the source region 18a and the drain region 18b are arranged so that the respective interfaces between the semiconductor substrate 10 and the source and drain regions 18a and 18b are located in lower positions than the upper faces of the convex portions 11b of the channel region 11 (FIG. 1(a)), and are located in higher positions than the lower faces of the leg portions 16b of the gate electrode 16. Also, the source region 18a and the drain region 18b are arranged so that the upper faces of the source region 18a and the drain region 18b are located in higher positions than the bottom face of the main body portion 16a of the gate electrode 16. Gate sidewalls 20 made of an insulating material are provided on the side faces of the gate electrode 16 perpendicular to the first direction. If the source region 18a and the drain region 18b are n-type impurity regions, the transistor 1 is an n-channel transistor. If the source region 18a and the drain region 18b are p-type impurity regions, the transistor 1 is a p-channel transistor.

Comparative Examples

Figure 2:
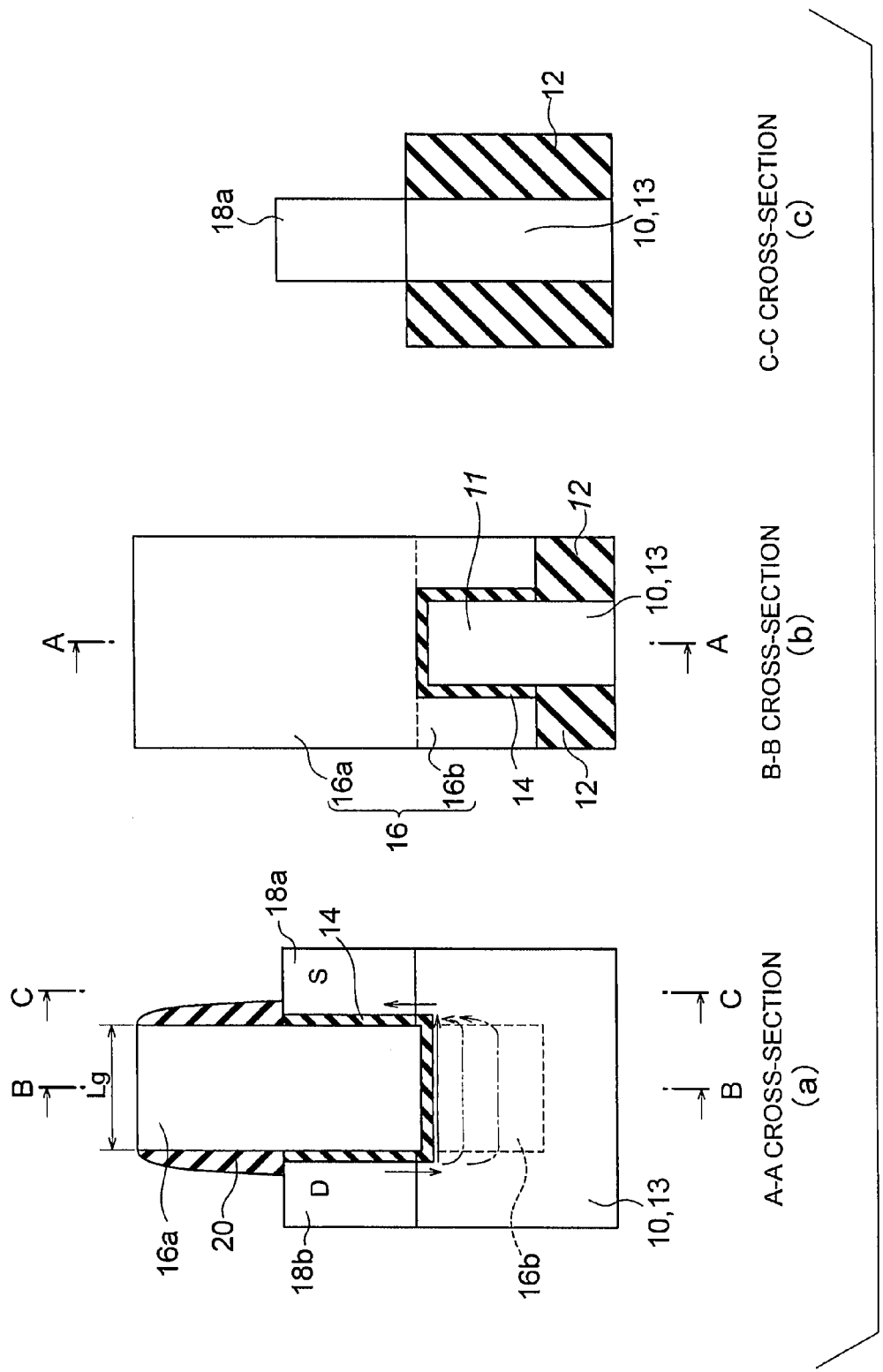
FIGS. 2(a) through 2(c) are cross-sectional views of a semiconductor device according to a comparative example.

FIGS. 2(a), 2(b), and 2(c) illustrate a transistor according to a comparative example of the first embodiment. FIG. 2(a) shows a cross-sectional view of the transistor of this comparative example. FIGS. 2(b) and 2(c) show cross-sectional views of the transistor of the comparative example, taken along the section lines B-B and C-C, respectively, of FIG. 2(a). FIG. 2(a) shows a cross-sectional view of the transistor, taken along the section line A-A of FIG. 2(b).

The transistor of this comparative example has the same structure as that of the transistor of the first embodiment, except that the length of the leg portions 16b of the gate electrode 16 in the first direction differs from that in the transistor of the first embodiment illustrated in FIGS. 1(a) through 1(d). That is, in the transistor of the comparative example, the length of the leg portions 16b of the gate electrode 16 in the first direction is smaller than that in the transistor of the first embodiment, and is almost the same as the gate length Lg of the gate electrode 16. It should be noted that the transistor of this comparative example is a known S-Fin transistor.

Figure 3:
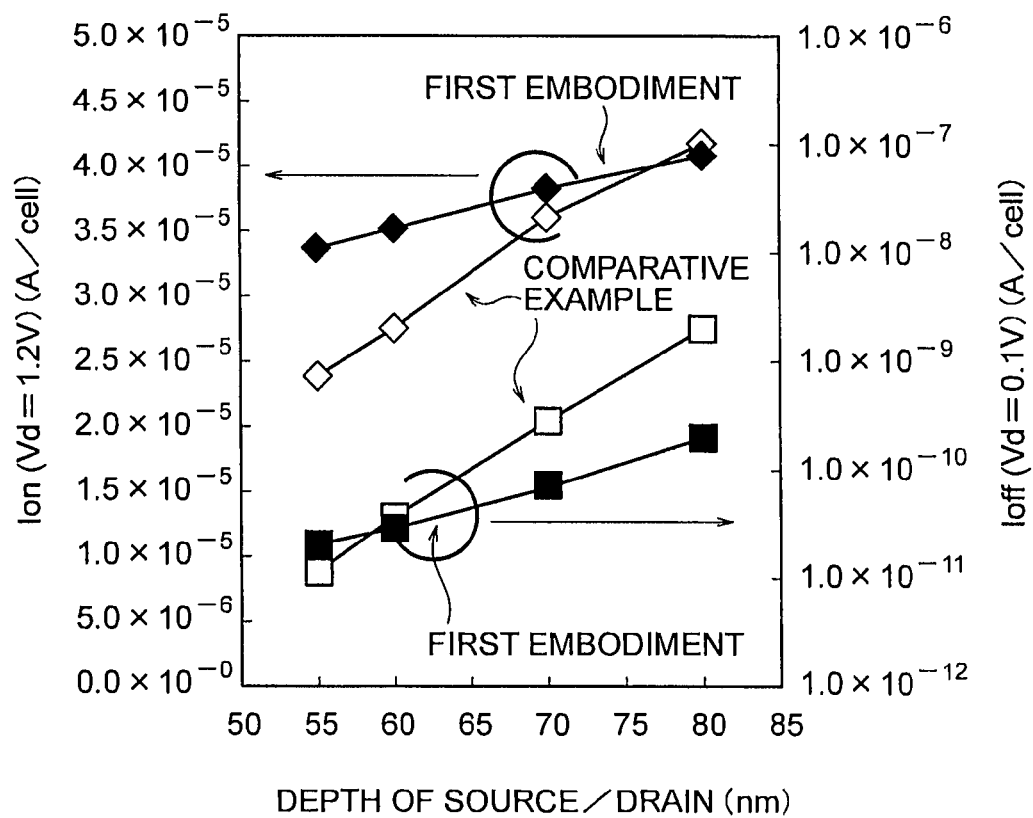
FIG. 3 is a diagram showing the dependence of on-state current and off-state current on the depth of the source and drain in the first embodiment and the comparative example.

FIG. 3 shows the results of simulations performed to determine the on-state current Ion and the off-state current leakage Ioff in a case where the depth D of the source and drain regions is varied in the transistor of the first embodiment and the transistor of the comparative example. The parameters of the transistors of the first embodiment and the comparative example used in the simulations are 25 nm in gate length Lg, 32 nm in gate width, and 1.8 nm in film thickness of the gate insulating film. Also, the distance from the interfaces between the semiconductor substrate and the source and drain regions to the lower face of the gate insulating film 14 is 60 nm, and the impurity density in the semiconductor substrate is $4 \times 10^{17}$/cm$^3$.

As can be seen from FIG. 3, in the transistor of the first embodiment, the on-state current Ion can be increased by a larger amount where the off-state current leakage Ioff is made constant, and the off-state current leakage Ioff can be reduced by a larger amount where the on-state current Ion is made constant, than in the transistor of the comparative example.

As described above, according to the first embodiment, the length of the leg portions 16b of the gate electrode 16 is greater than the gate length Lg, and the interfaces between the semiconductor substrate and the source and drain regions are located in deeper positions than the region 11a including the saddle point of the channel region 11. Accordingly, electrons are easily injected into the channel region 11, and the drive current is increased. Also, since the interfaces between the semiconductor substrate and the source and drain regions are located in deeper positions than the region 11a including the saddle point of the channel region 11, the side faces of the channel region 11 can be more effectively used as the current path, and the drive current can be increased.

In the comparative example, the side faces of the channel can also be used as the current path by increasing the depth of the source and drain regions. However, the off-state current leakage also increases due to punch-through.

In this embodiment, because of the formation of the convex portions 11b of the channel region 11, the gate length can be effectively increased, and punch-through can be restrained. Accordingly, the off-state current leakage can be reduced.

Also, since the leg portions 16b of the gate electrode 16 are long in the first direction, electrons are easily injected into the channel region 11, and the drive current can be increased.

Figure 4:
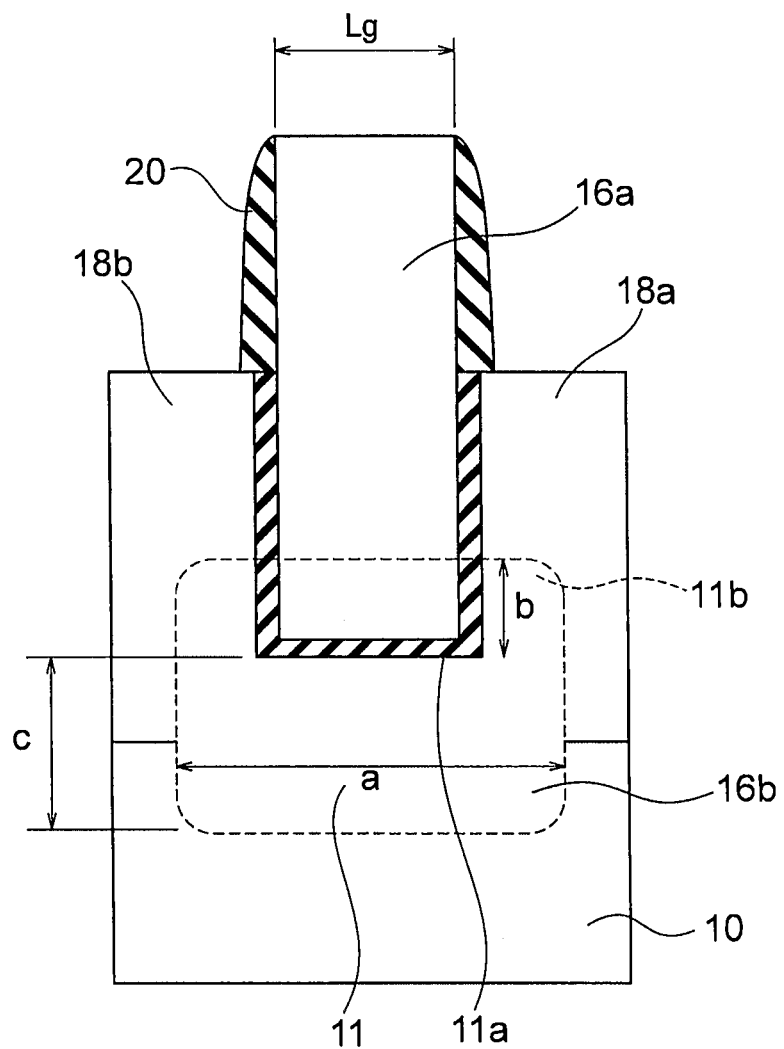
FIG. 4 illustrates size ranges in the semiconductor device of the first embodiment.

As shown in FIG. 4, in the transistor 1 of the first embodiment, the length a of the leg portions 16b of the gate electrode 16 in the first direction is preferably in the range of 1.8 to 2.0 Lg, where Lg represents the gate length. If the length a is smaller than 1.8 Lg, the effect to reduce the off-state current leakage becomes smaller. In a case where the transistor 1 of this embodiment is used as a cell transistor in a memory, the probability that the transistor 1 is in contact with the leg portions of the gate electrodes of adjacent cell transistors becomes higher, if the length a is greater than 2 Lg. If the height b of the convex portions 11b of the channel region 11 is greater than "0", the off-state current leakage generated due to punch-through can be reduced. Also, the interfaces between the semiconductor substrate 10 and the source and drain regions 18a and 18b are preferably located in shallower positions than the lower faces of the leg portions 16b of the gate electrode 16. The distance c from the upper face of the region 11a including the saddle point of the channel region 11 to the lower faces of the leg portions 16b of the gate electrode 16 is preferably in the range of 1.2 to 2 Lg. Even if the distance c becomes longer than 2 Lg, the effect to reduce the off-state current leakage does not become larger.

(Manufacturing Method)

Figure 5:
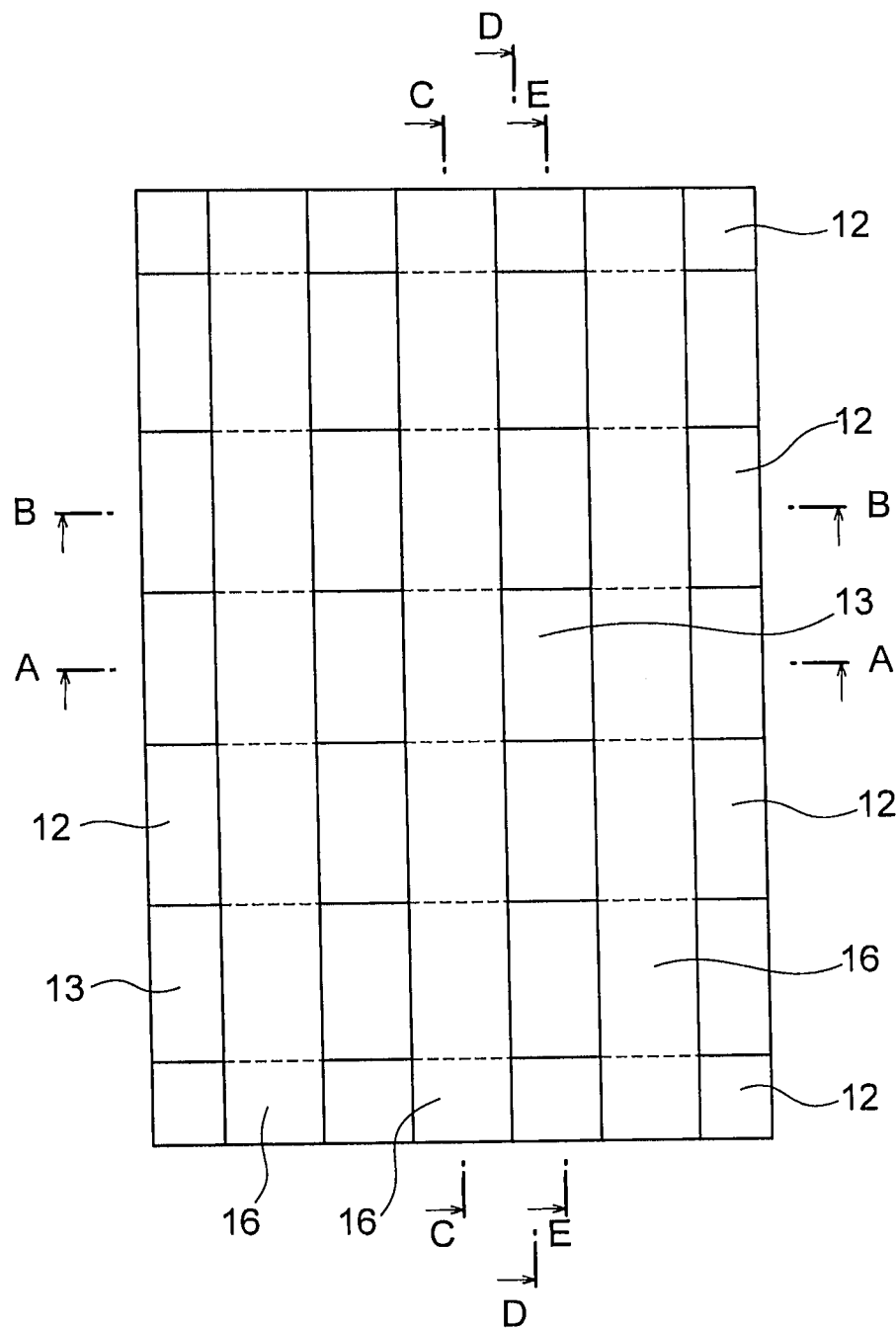
FIG. 5 is a top view of semiconductor devices of the first embodiment.
Figure 6:
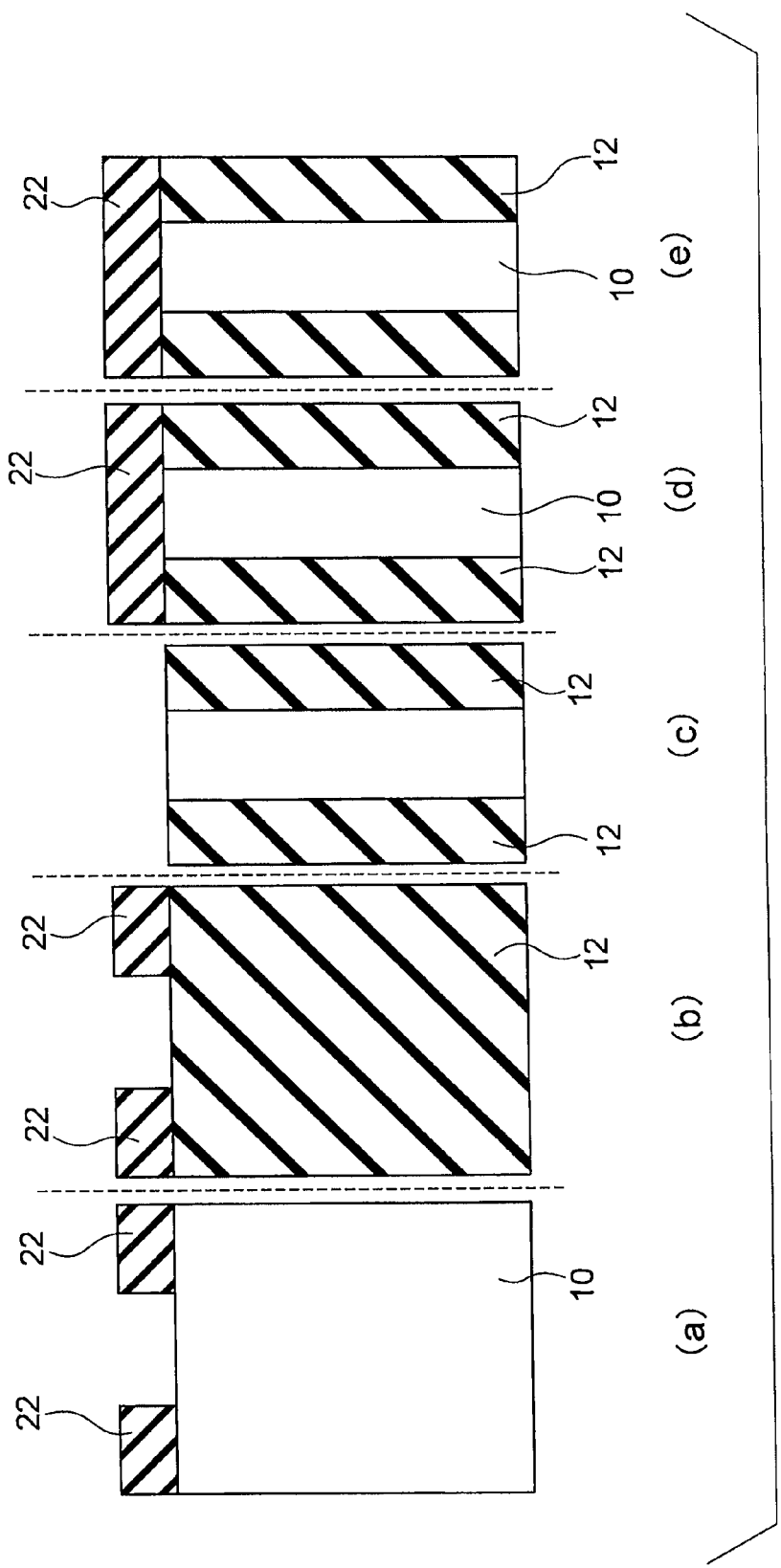
FIGS. 6(a) through 6(e) are cross-sectional views showing procedures for manufacturing semiconductor devices of the first embodiment.
Figure 7:
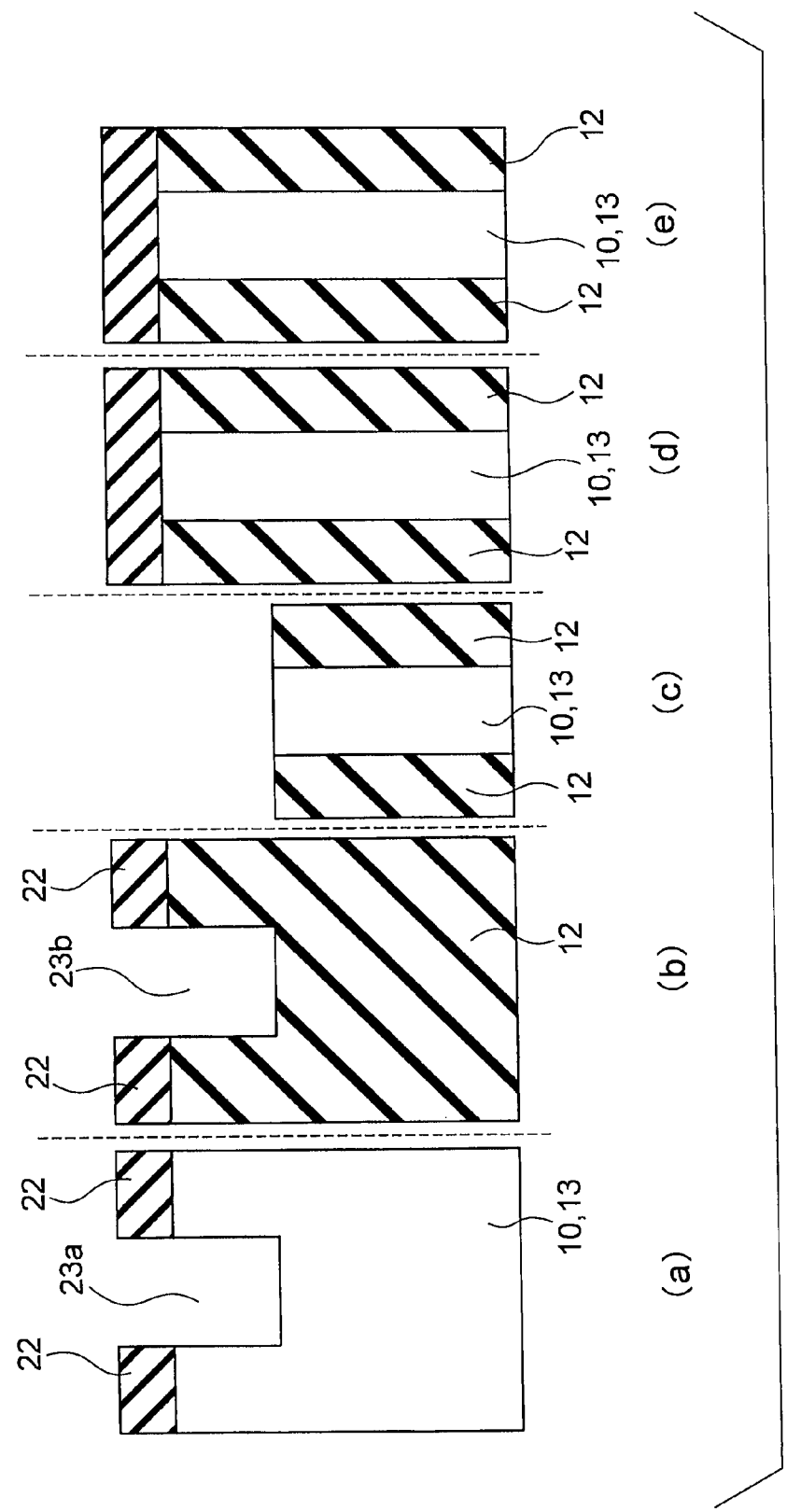
FIGS. 7(a) through 7(e) are cross-sectional views showing procedures for manufacturing semiconductor devices of the first embodiment.
Figure 8:
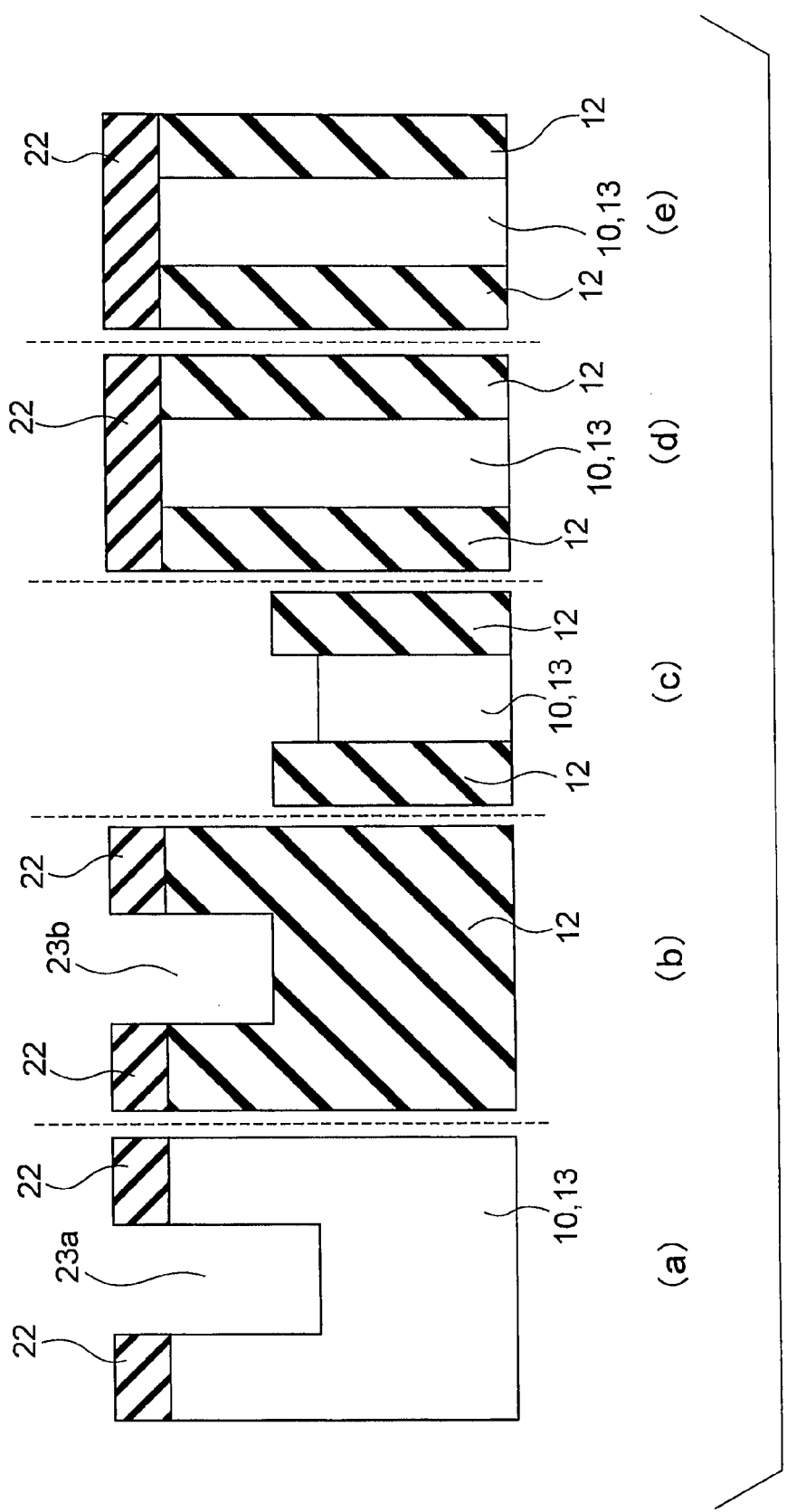
FIGS. 8(a) through 8(e) are cross-sectional views showing procedures for manufacturing semiconductor devices of the first embodiment.
Figure 9:
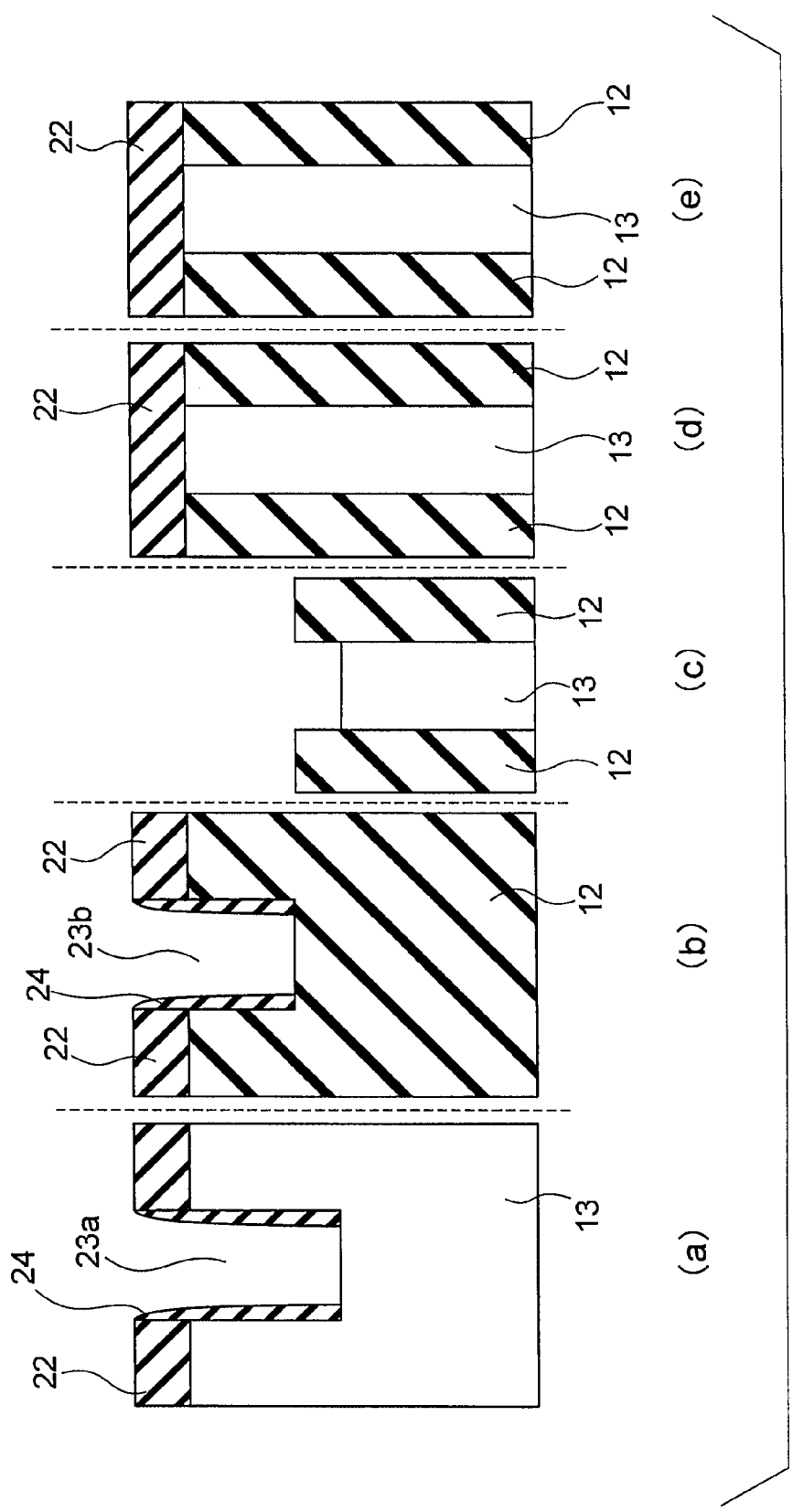
FIGS. 9(a) through 9(e) are cross-sectional views showing procedures for manufacturing semiconductor devices of the first embodiment.
Figure 10:
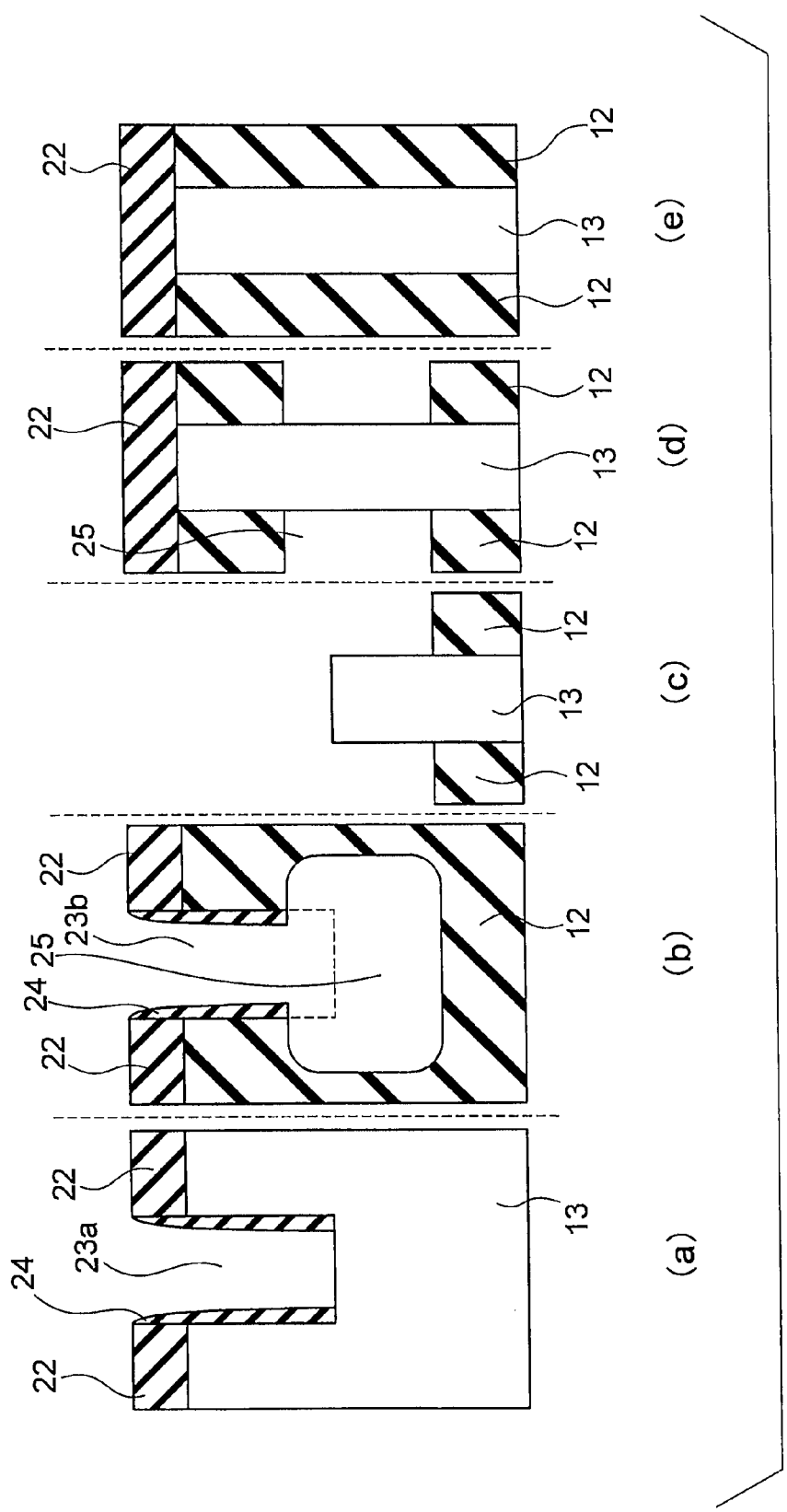
FIGS. 10(a) through 10(e) are cross-sectional views showing procedures for manufacturing semiconductor devices of the first embodiment.
Figure 11:
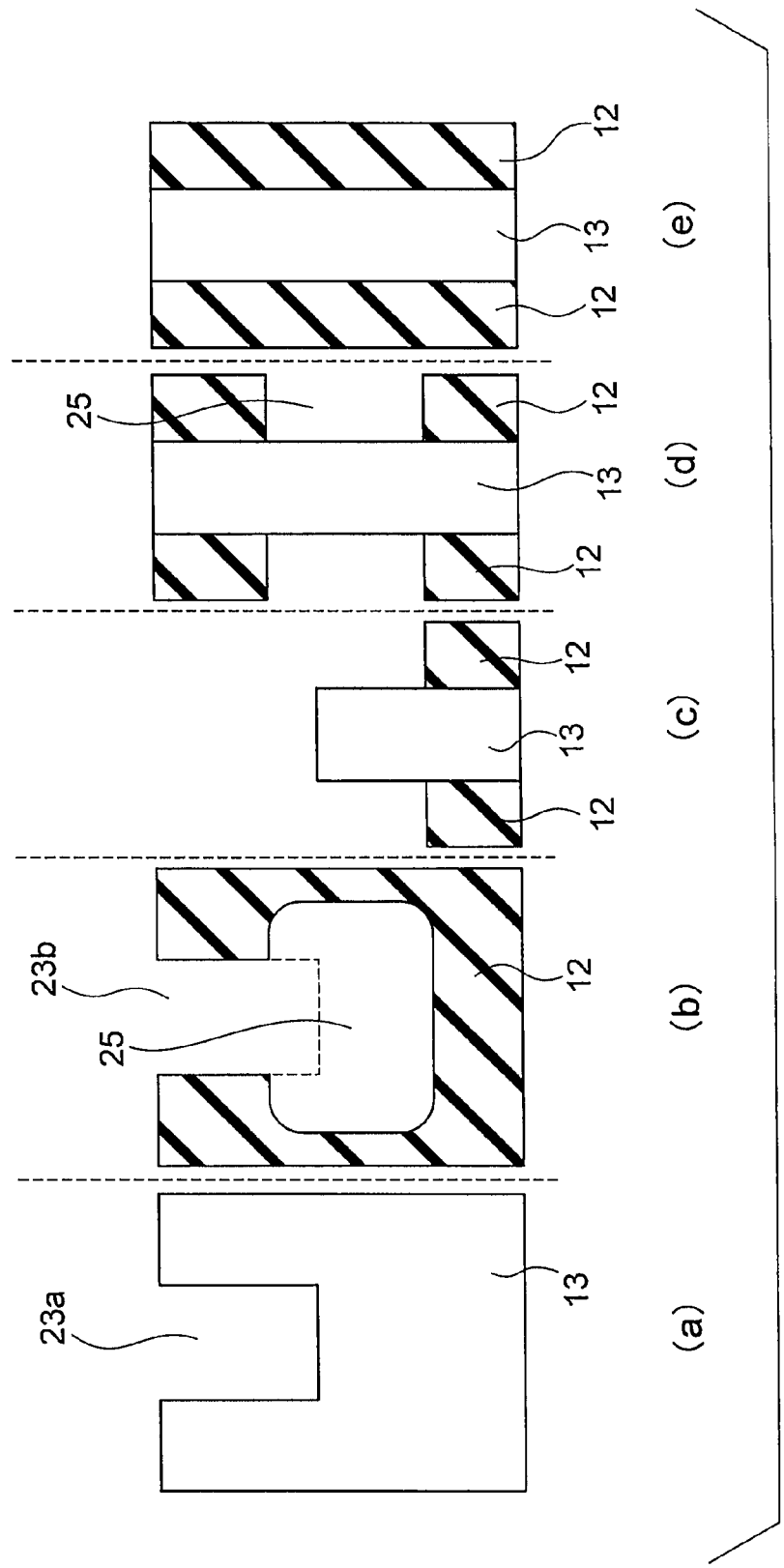
FIGS. 11(a) through 11(e) are cross-sectional views showing procedures for manufacturing semiconductor devices of the first embodiment.
Figure 12:
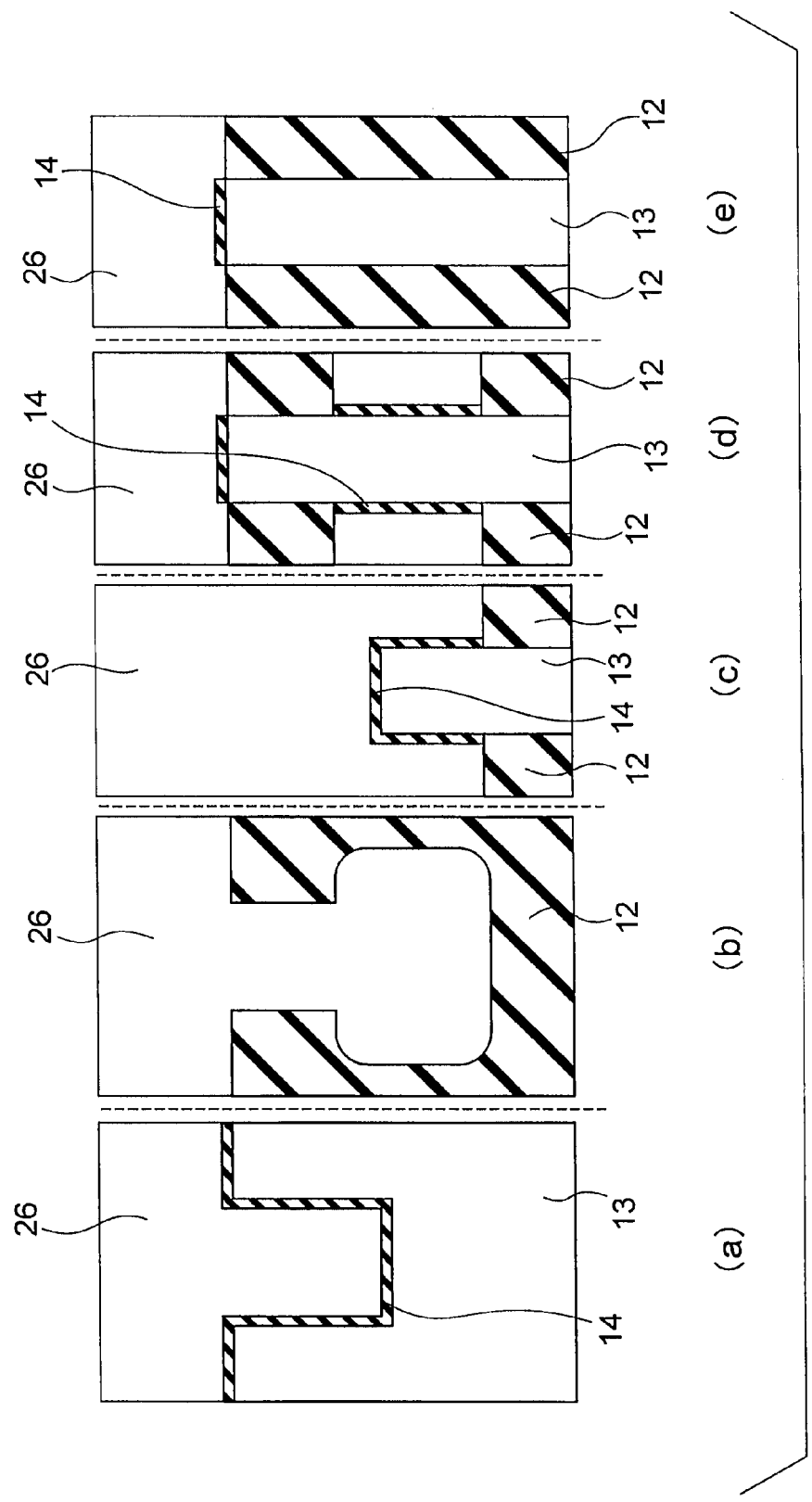
FIGS. 12(a) through 12(e) are cross-sectional views showing procedures for manufacturing semiconductor devices of the first embodiment.
Figure 13:
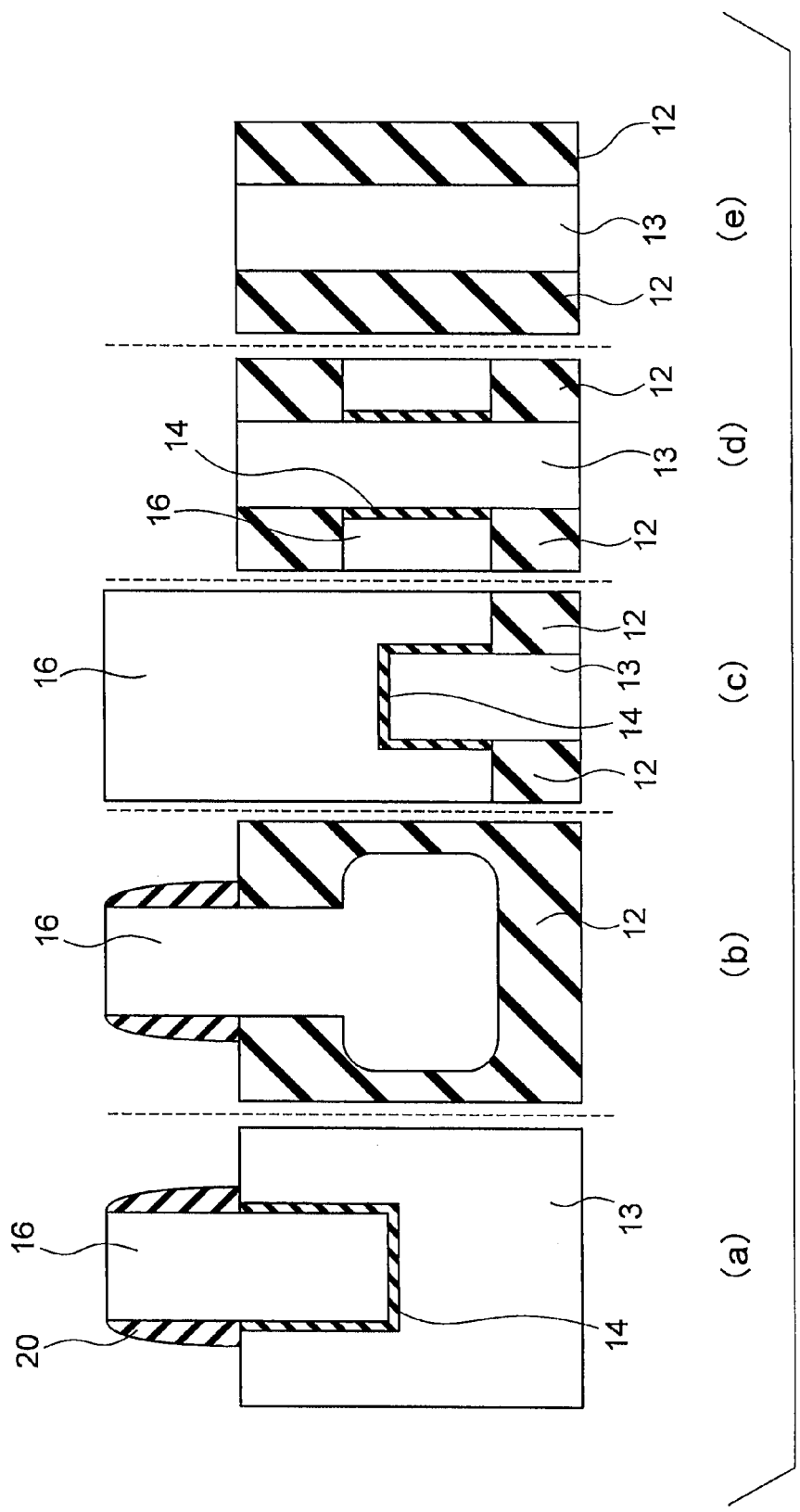
FIGS. 13(a) through 13(e) are cross-sectional views showing procedures for manufacturing semiconductor devices of the first embodiment.
Figure 14:
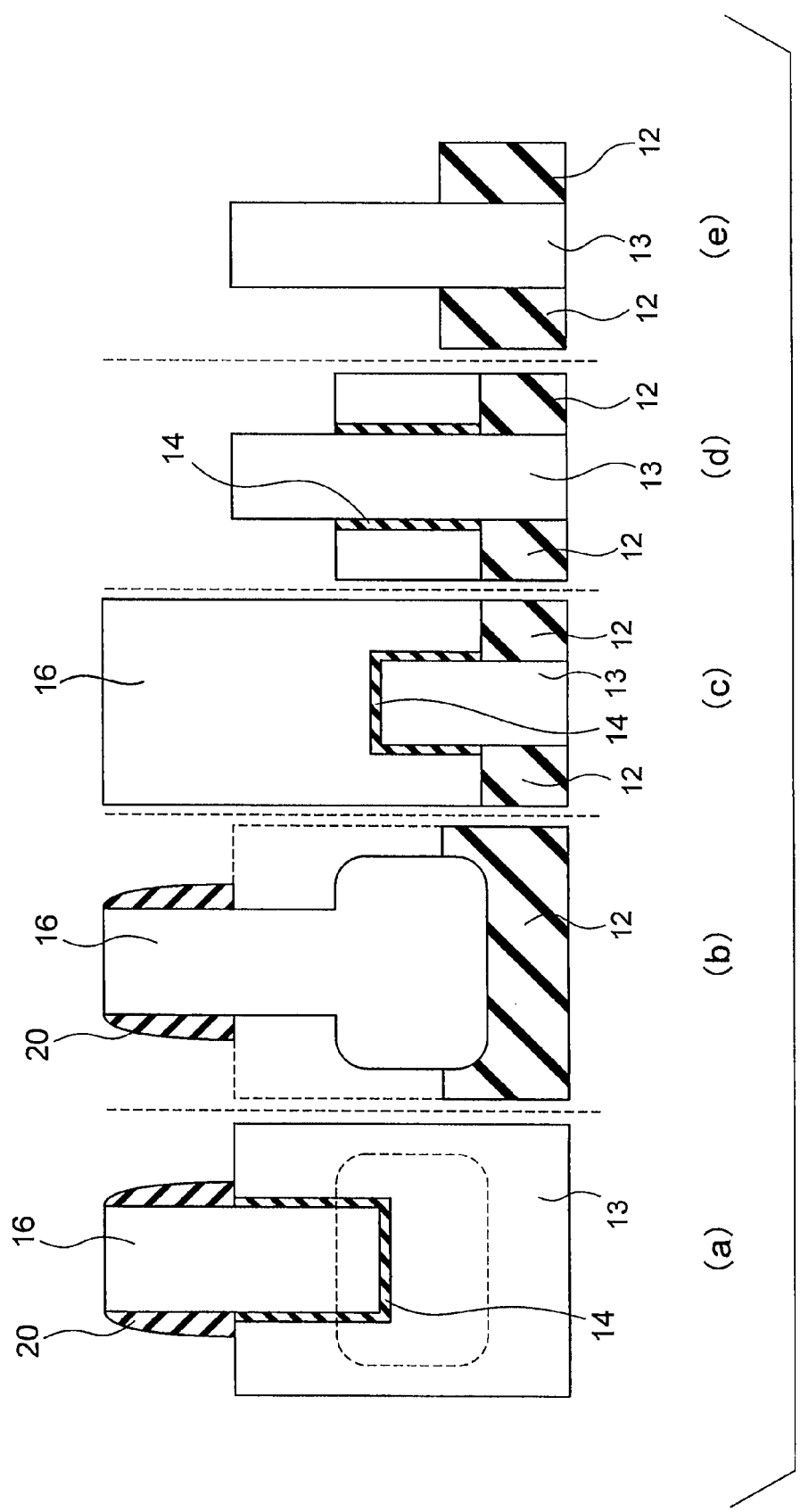
FIGS. 14(a) through 14(e) are cross-sectional views showing procedures for manufacturing semiconductor devices of the first embodiment.
Figure 15:
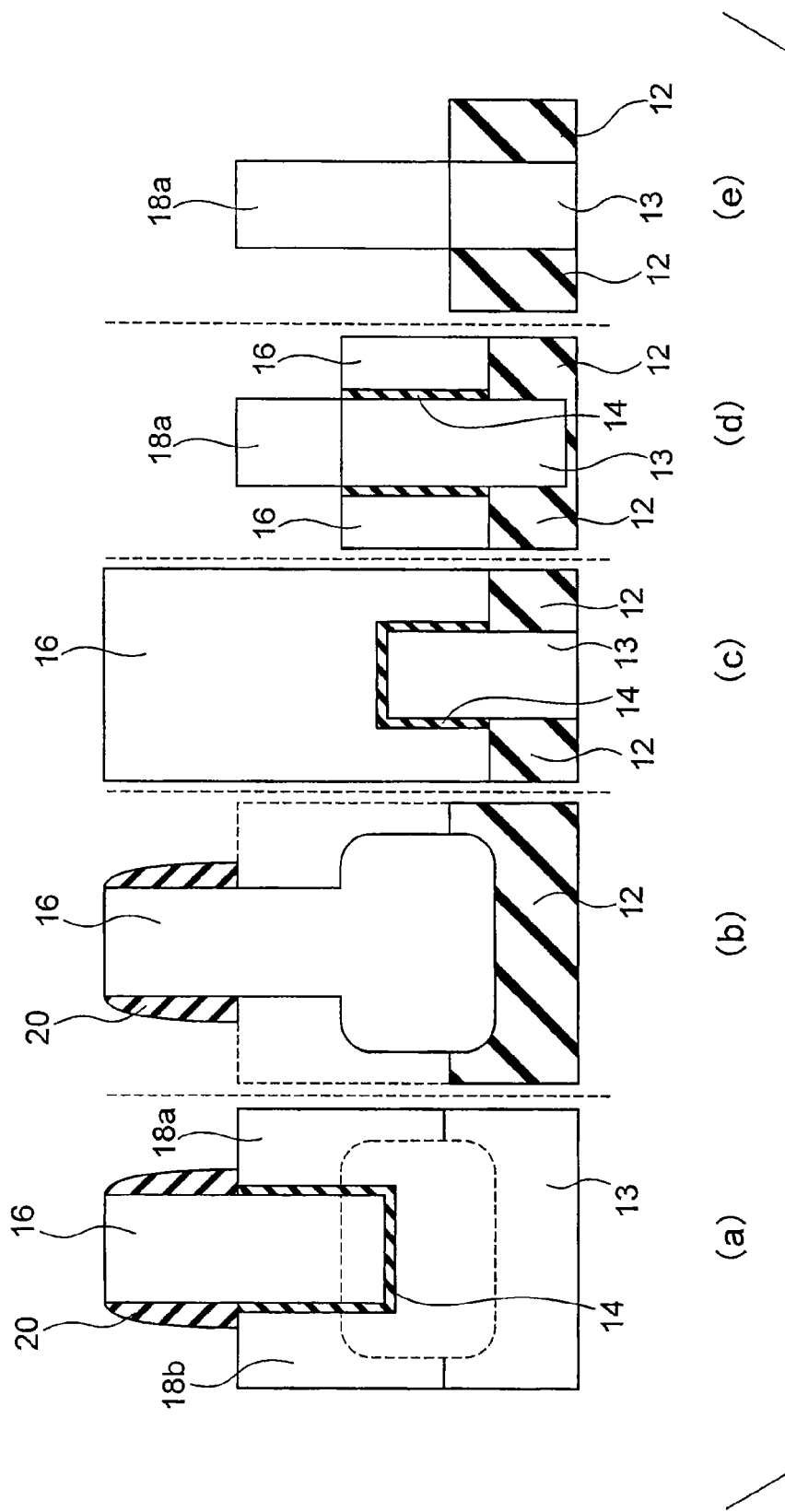
FIGS. 15(a) through 15(e) are cross-sectional views showing procedures for manufacturing semiconductor devices of the first embodiment.

Referring now to FIGS. 5 through 15(e), a method of manufacturing the transistor 1 of the first embodiment is described. FIG. 5 is a top view of cell transistors 1 that are integrally formed. FIGS. 6(a), 7(a), 8(a), 9(a), 10(a), 11(a), 12(a), 13(a), 14(a), and 15(a) are cross-sectional views showing manufacturing procedures, taken along the section line A-A of FIG. 5. FIGS. 6(b), 7(b), 8(b), 9(b), 10(b), 11(b), 12(b), 13(b), 14(b), and 15(b) are cross-sectional views showing manufacturing procedures, taken along the section line B-B of FIG. 5. FIGS. 6(c), 7(c), 8(c), 9(c), 10(c), 11(c), 12(c), 13(c), 14(c), and 15(c) are cross-sectional views showing manufacturing procedures, taken along the section line C-C of FIG. 5. FIGS. 6(d), 7(d), 8(d), 9(d), 10(d), 11(d), 12(d), 13(d), 14(d), and 15(d) are cross-sectional views showing manufacturing procedures, taken along the section line D-D of FIG. 5. FIGS. 6(e), 7(e), 8(e), 9(e), 10(e), 11(e), 12(e), 13(e), 14(e), and 15(e) are cross-sectional views showing manufacturing procedures, taken along the section line E-E of FIG. 5.

First, the device isolating regions 12 such as STIs (Shallow Trench Isolations) are formed in the semiconductor substrate 10, and the device regions 13 for forming the cell transistors 1 are formed (FIG. 5 and FIGS. 6(a) through 6(e)). A hard mask material such as SiN is then formed as a film on the semiconductor substrate 10, and patterning is performed on the hard mask material by a lithography technique, to form a hard mask 22 (FIGS. 6(a) through 6(e)). This hard mask 22 has respective openings for the device regions 13 and the device isolating regions 12.

As shown in FIGS. 7(a) through 7(e), etching is performed on the device regions 13 and the device isolating regions 12 with the use of the hard mask 22, and concave portions 23a and 23b are formed in the device regions 13 and the device isolating regions 12, respectively. Etching is then selectively performed on the device regions 13 with the use of the hard mask 22. At this point, etching is hardly performed on the device isolating regions 12 (FIGS. 8(a) through 8(e)).

As shown in FIGS. 9(a) through 9(e), side walls 24 made of an insulating material such as SiN are formed on the side portions of the concave portions 23a in the device regions 13 and on the side portions of the concave portions 23b in the device isolating regions 12. As shown in FIGS. 10(a) through 10(e), with the hard mask 22 and the sidewalls 24 serving as masks, the device isolating regions 12 are processed by isotropic etching with high selectivity. As a result, cavities 25 leading to the concave portions 23b in the device isolating regions 12 are formed, as shown in FIGS. 10(b) and 10(d). Also, the exposed upper faces of the device isolating regions 12 become lower, as shown in FIG. 10(c). The hard mask 22 and the sidewalls 24 are then selectively removed, as shown in FIGS. 11(a) through 11(e).

As shown in FIGS. 12(a) through 12(e), the gate insulating film 14 is then formed to cover the exposed surfaces of the device regions 13. A polysilicon film 26 is deposited to fill the cavities 25 and the concave portions 23a and 23b. After that, the upper face of the polysilicon film 26 is flattened.

As shown in FIGS. 13(a) through 13(e), patterning is performed to form the polysilicon film 26 into gate electrode shapes by a lithography technique, and the gate electrodes 16 are formed. By using a known technique, the sidewalls 20 made of an insulating material are then formed on the side portions of the gate electrodes 16 exposed through the device regions 13. As shown in FIGS. 14(a) through 14(e), etching is then selectively performed on the device isolating regions 12.

As shown in FIGS. 15(a) through 15(e), by using a technique such as ion implantation or plasma doping, impurities are introduced into the exposed device regions. After that, annealing is performed to activate the introduced impurities, and the source and drain regions 18a and 18b are formed. An interlayer insulating film is then deposited, and respective openings leading to the source and drain regions 18a and 18b and the gate electrodes 16 are formed in the interlayer insulating film. Those openings are filled with an electrode material, and contacts are formed. Interconnects to be connected to the contacts are then formed on the interlayer insulating film, and the transistors are completed.

As described above, the first embodiment can provide a semiconductor device including a transistor to which sufficient current can be applied.

Second Embodiment

Figure 16:
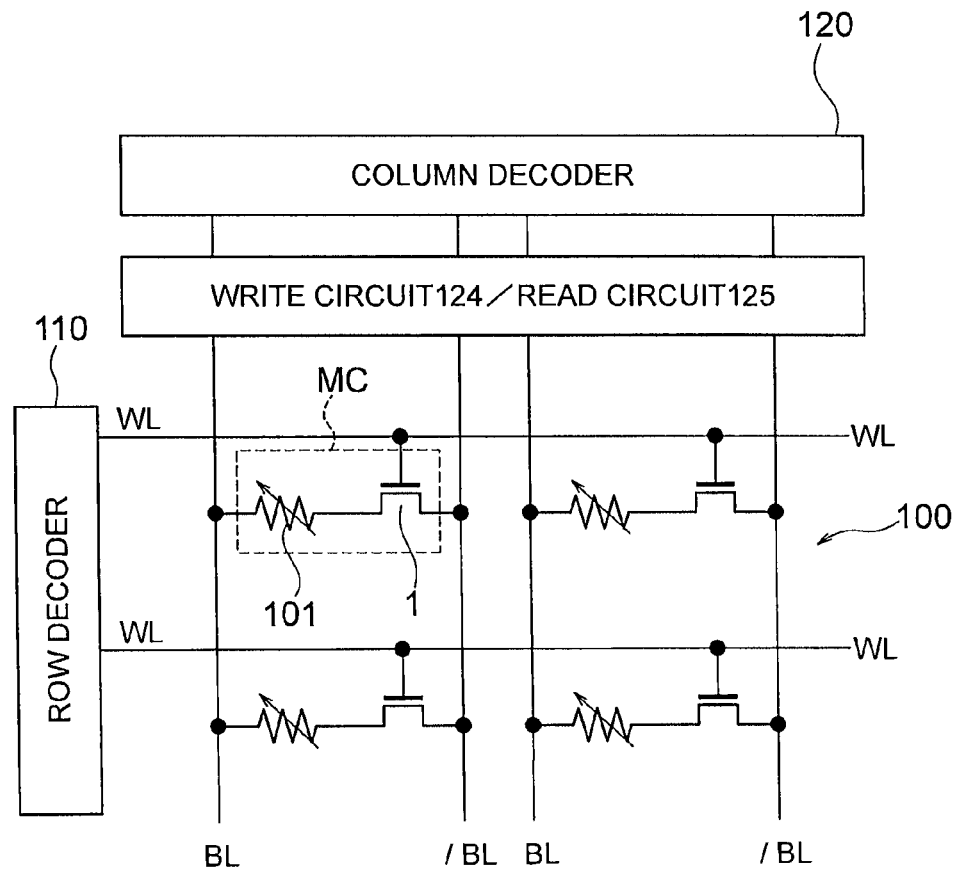
FIG. 16 is a circuit diagram of a semiconductor device according to a second embodiment.
Figure 17:
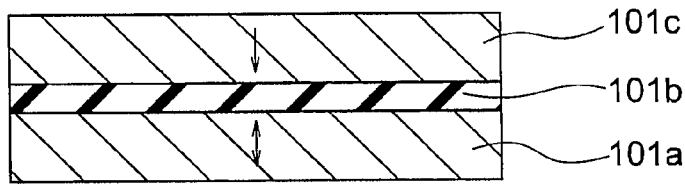
FIG. 17 is a cross-sectional view of a MTJ used in the semiconductor device of the second embodiment.

Referring now to FIGS. 16 and 17, a semiconductor device of a second embodiment is described. The semiconductor device of the second embodiment is a MRAM. FIG. 16 is a circuit diagram of this MRAM. In the MRAM of this embodiment, MTJs 101 are used as the storage elements of memory cells, and the transistor 1 of the first embodiment is used as each cell transistor.

As shown in FIG. 17, each of the MTJs 101 includes: a free magnetization layer 101a having a magnetic layer with a changeable magnetization (or spin) direction; a fixed magnetization layer 101c (also referred to as the reference layer 101c) having a magnetic layer with a fixed magnetization direction; and a tunnel barrier layer 101b interposed between the free magnetization layer 101a (also referred to as the memory layer 101a) and the fixed magnetization layer 101c, for example. Here, a "changeable" magnetization direction is a magnetization direction that is reversed or rotates 180 degrees after the later described write current is applied. A "fixed" magnetization direction is a magnetization direction that does not change even after the write current is applied. It should be noted that the free magnetization layer and the fixed magnetization layer may be stack structures each having magnetic layers and a nonmagnetic layer interposed between those magnetic layers.

To change the magnetization direction of the free magnetization layer 101a, the direction of the current to be applied to the MTJ 101 is changed. For example, in a case where the spin directions of the free magnetization layer 101a and the fixed magnetization layer 101c are to be changed from a parallel state to an antiparallel state, electrons are injected from the free magnetization layer 101a to the fixed magnetization layer 101c through the tunnel barrier layer 101b. In this case, the electrons that have passed through the free magnetization layer 101a are spin-polarized, and the spin-polarized electrons are sent to the fixed magnetization layer 101c through the tunnel barrier layer 101b. The spin-polarized electrons having the same magnetization direction as that of the fixed magnetization layer 101c pass through the fixed magnetization layer 101c, but the spin-polarized electrons having the opposite magnetization direction from that of the fixed magnetization layer 101c are reflected by the interface between the tunnel barrier layer 101b and the fixed magnetization layer 101c, and are sent to the free magnetization layer 101a. The magnetization direction of the free magnetization layer 101a is then reversed by the spin-polarized electrons having the opposite magnetization direction from that of the fixed magnetization layer 101c. In this manner, the magnetization direction of the free magnetization layer 101a is made antiparallel to the magnetization direction of the fixed magnetization layer 101c.

In a case where the spin directions of the free magnetization layer 101a and the fixed magnetization layer 101c are to be changed from an antiparallel state to a parallel state, electrons are injected from the fixed magnetization layer 101c to the free magnetization layer 101a through the tunnel barrier layer 101b. In this case, the electrons that have passed through the fixed magnetization layer 101c are spin-polarized, and the spin-polarized electrons are sent to the free magnetization layer 101a through the tunnel barrier layer 101b. The magnetization direction of the free magnetization layer 101a is reversed by the spin-polarized electrons having the same magnetization direction as that of the fixed magnetization layer 101c, and becomes parallel to the magnetization direction of the fixed magnetization layer 101c. When the magnetization direction of the free magnetization layer 101a and the magnetization direction of the fixed magnetization layer 101c are in a parallel state, the electrical resistance of the MTJ 101 is low. When the magnetization direction of the free magnetization layer 101a and the magnetization direction of the fixed magnetization layer 101c are in an antiparallel state, the electrical resistance of the MTJ 101 is high.

The MRAM of the second embodiment includes a memory cell array 100 having memory cells MC arranged in a matrix fashion. In the memory cell array 100, bit lines pairs BL and /BL are arranged to extend in the column direction. Also, in the memory cell array 100, word lines WL are arranged to extend in the row direction.

The memory cells MC are located at the intersection portions between the bit lines BL and the word lines WL. Each of the memory cells MC includes a MTJ 101 and a cell transistor 1 that is an n-channel MOS transistor. One end of the MTJ 101 is connected to the corresponding bit line BL. The other end of the MTJ 101 is connected to a drain terminal of the cell transistor 1. The gate terminal of the cell transistor 1 is connected to the corresponding word line WL. The source terminal of the cell transistor 1 is connected to the corresponding bit line /BL.

A row decoder 110 is connected to the word lines WL. A write circuit 124 and a read circuit 125 are connected to the bit line pairs BL and /BL. A column decoder 120 is connected to the write circuit 124 and the read circuit 125. Each of the memory cells MC is selected by the row decoder 110 and the column decoder 120.

Data is written into a memory cell MC in the following manner. First, to select a memory cell MC into which data is to be written, the word line WL connected to the memory cell MC is activated. As a result of this, the cell transistor 1 is put into an ON state. At this point, a bidirectional write current Iw is supplied to the MTJ 101 in accordance with write data. Specifically, in a case where the write current Iw is supplied to the MTJ 101 from left to right in FIG. 16, the write circuit 124 applies a positive voltage to the corresponding bit line BL, and applies a ground voltage to the corresponding bit line /BL. In a case where the write current Iw is supplied to the MTJ 101 from right to left in FIG. 16, the write circuit 124 applies a positive voltage to the corresponding bit line /BL, and applies a ground voltage to the corresponding bit line BL. In this manner, data "0" or data "1" can be written into the memory cell MC.

Data is read from a memory cell MC in the following manner. First, to select a memory cell MC from which data is to be read, the word line WL connected to the memory cell MC is activated. As a result of this, the cell transistor 1 of the selected memory cell MC is put into an ON state. The read circuit 125 supplies a read current Ir to the MTJ 101 from right to left in FIG. 16, for example. Based on the read current Ir, the read circuit 125 detects the resistance value in the MTJ 101. In this manner, the data stored in the MTJ 101 can be read out.

According to the second embodiment, a MRAM can be formed by using the transistor 1 of the first embodiment. This MRAM has small off-state current leakage, and can achieve a great current driving force.

Despite being a nonvolatile memory, this MRAM is capable of performing operations at a speed almost as high as the operation speed of a DRAM. Also, the MTJs as the memory elements of the MRAM are more beneficial in miniaturization than capacitors as the memory elements of a DRAM, and are considered more suitable for miniaturization than the capacitors. Further, the MRAM can be used as an on-chip memory in a so-called CMOS logic LSI.

Third Embodiment

Figure 18:
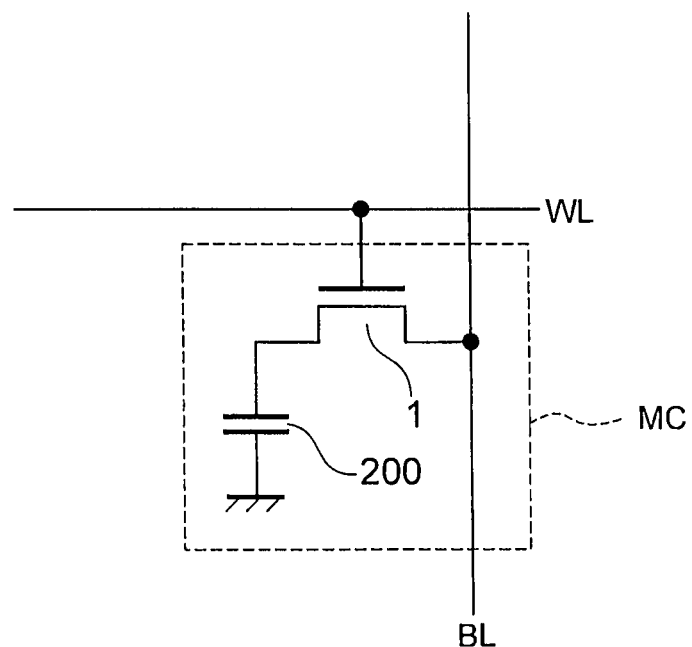
FIG. 18 is a circuit diagram of a memory cell in a semiconductor device according to a third embodiment.

Referring now to FIG. 18, a semiconductor device of a third embodiment is described. The semiconductor device of the third embodiment is a DRAM, and this DRAM includes at least one memory cell. FIG. 18 illustrates the memory cell. The memory cell MC of the DRAM according to the third embodiment includes a capacitor 200 to serve as a memory element and an n-channel cell transistor 1. The transistor 1 of the first embodiment is used as the cell transistor 1. The gate of the cell transistor 1 is connected to a word line WL, the drain is connected to a bit line BL, and the source is connected to one end of the capacitor 200. The other end of the capacitor 200 is grounded.

According to the third embodiment, a DRAM can be formed with the use of the transistor 1 of the first embodiment. This DRAM has small off-state current leakage, and can achieve a great current driving force.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:
1. A semiconductor device comprising:
  a semiconductor substrate;
  a semiconductor region formed on the semiconductor substrate, the semiconductor region having an upper face and side faces forming a saddle-like shape, the semicon- ductor region comprising convex portions formed at both ends of a region including a saddle point in the upper face, the both ends lying in a first direction;

a gate insulating film formed on the upper face of the semiconductor region except upper faces of the convex portions, on side faces of the semiconductor region extending in the first direction, and on side faces of the convex portions on a side of the region including the saddle point in the upper face, the side faces of the convex portions extending in a second direction perpendicular to the first direction, the second direction being parallel to the upper face of the semiconductor region;

a gate electrode formed on the gate insulating film, the gate electrode including: a main body portion including a first portion and second portions, the first portion located above the region including the saddle point in the upper face, a width in the second direction of the first portion being greater than a width in the second direction of the region including the saddle point in the upper face, the second portions being connected to the first portion, covering the side faces of the semiconductor region extending in the first direction and located in higher position than the region including the saddle point in the upper face, a first length of the first portion in the first direction being smaller than a second length of each of the second portions in the first direction; and leg portions connected to the second portions of the main body portion and covering the side faces of the semiconductor region extending in the first direction, a third length of each of the leg portions in the first direction being greater than the first length of the first portion and being substantially the same as the second length of each of the second portions; and first and second impurity regions formed in portions of the semiconductor region, the portions being located on both sides of the gate electrode, each of first and second impurity regions including a third portion and a fourth portion connected to the third portion, the third portion being formed at the convex portions in the semiconductor region and located in higher position than upper faces of the second portions of the gate electrode, the fourth portion being located between the third portion and the semiconductor substrate, a length of the third portion in the first direction is greater than a length of the fourth portion in the first direction.

2. The semiconductor device according to claim 1, wherein the third length of each of the leg portions of the gate electrode in the first direction is in the range of 1.8 Lg to 2.0 Lg, where Lg represents the first length of the first portion in the first direction.

3. The semiconductor device according to claim 1, wherein interfaces between the semiconductor substrate and the first and second impurity regions are located in shallower positions than lower faces of the leg portions of the gate electrode, and a distance from an upper face of the region including the saddle point in the upper face of the semiconductor region to lower faces of the leg portions of the gate electrode is in the range of 1.2 Lg to 2 Lg, where Lg represents the first length of the first portion in the first direction.

4. The semiconductor device according to claim 1, wherein a length of the semiconductor region in the first direction is greater than the second length of the second portion in the first direction.

5. The semiconductor device according to claim 1, wherein the first and second impurity regions are formed to cover upper faces of the convex portions in the semiconductor region and part of side faces of the convex portions, the side faces being perpendicular to the first direction.

6. The semiconductor device according to claim 5, wherein respective interfaces between the semiconductor substrate and the first and second impurity regions are located in lower positions than the upper faces of the convex portions, and are located in shallower positions than lower faces of the leg portions of the gate electrode.

7. The semiconductor device according to claim 1, wherein upper faces of the first and second impurity regions are located in higher positions than a bottom face of the main body portion of the gate electrode.

8. The semiconductor device according to claim 1, further comprising:

a MTJ including a free magnetization layer having a magnetic layer with a variable magnetization direction, a fixed magnetization layer having a fixed magnetization direction, and a tunnel barrier layer interposed between the free magnetization layer and the fixed magnetization layer, one of the free magnetization layer and the fixed magnetization layer being electrically connected to one of the first and second impurity regions;

a first interconnect electrically connected to the gate electrode;

a second interconnect electrically connected to the other one of the first and second impurity regions; and a third interconnect electrically connected to the other one of the free magnetization layer and the fixed magnetization layer.

9. The semiconductor device according to claim 8, wherein the third length of each of the leg portions of the gate electrode in the first direction is in the range of 1.8 Lg to 2.0 Lg, where Lg represents the first length of the portion in the first direction.

10. The semiconductor device according to claim 8, wherein interfaces between the semiconductor substrate and the first and second impurity regions are located in shallower positions than lower faces of the leg portions of the gate electrode, and a distance from an upper face of the region including the saddle point in the upper face of the semiconductor region to lower faces of the leg portions of the gate electrode is in the range of 1.2 Lg to 2 Lg, where Lg represents the first length of the first portion in the first direction.

11. The semiconductor device according to claim 4, wherein a sum of lengths of the third portions of the first and second impurity regions is substantially the same as a value equal to L minus the first length, and a sum of the fourth portions of the first and second impurity regions is substantially the same as a value equal to L minus the second length, where L represents a length in the first direction of the semiconductor region.

* * * * *